Aug. 22, 1967 H. E. FERREE 3,337,781

ENCAPSULATION MEANS FOR A SEMICONDUCTOR DEVICE

Filed June 14, 1965

WITNESSES

Theodore F. Wrobel

Donald M. Winegar

INVENTOR

Herbert E. Ferree

BY

C. L. Menzemer

ATTORNEY

United States Patent Office 3,337,781

Patented Aug. 22, 1967

3,337,781

ENCAPSULATION MEANS FOR A SEMICONDUCTOR DEVICE

Herbert E. Ferree, Hempfield Township, Greensburg, Pa., assignor to Westinghouse Electric Corporation, Pittsburgh, Pa., a corporation of Pennsylvania Filed June 14, 1965, Ser. No. 463,794

9 Claims. (Cl. 317—234)

ABSTRACT OF THE DISCLOSURE

This invention provides a new encapsulation component for a semiconductor element for use in a compression bonded encapsulated semiconductor device. The component is part of the hermetic seal for the element while simultaneously acting as an integral component of the force means acting on the element to retain a good electrical conductive relationship between the components of the electrical circuit. The new component also has an integral weld ring for affixing the remainder of the hermetic seal thereto. The new component eliminates the requirement for two separate components, one for the hermetic seal and one for the compressive force means. An expandable metal ring inserted in a groove in the new component assists retaining the applied force on the resilient force members of the device.

This invention relates to a new and improved method of making electrical contact to a body of semiconductor material.

Heretofore, compression bonded encapsulated electrical devices, fabricated by known methods, employ a separate means for resiliently urging a semiconductor element by spring means into good electrical and thermal contact with an electrode means enclosed within a separate hermetic sealing means.

In instances where the spring means is not adjustable, the member cooperating with the spring means to achieve the resilient force on the electrical components is joined directly to the support member. Enclosing this structure is a header assembly which, when joined to the support, also provides a hermetic enclosure.

In variable compression compacted devices, the member cooperating with the resilient means may be joined to the support by either of two methods.

One method is to employ a cylindrical metal member having an integrally connected apertured cap at the upper end and a threaded segment on the inner periphery of the lower end to threadedly engage the support to subject the resilient means to compression loading.

A second method is to have a cylindrical metal member joined to the support at the lower end and a threaded segment on the inner periphery of the upper end to accommodate an externally threaded member. The cylindrical member and the externally threaded member cooperate with the resilient means to supply the compression forces to the electrical components.

However, in both instances a separate header means is necessary to accomplish hermetic sealing of the devices.

An object of this invention is to provide a semiconductor device in which a portion of the case member cooperates with spring means to hold a semiconductor element in good electrical and thermal contact with a base member and at least one other electrical conductor.

Another object of this invention is to provide a semiconductor device in which a portion of the case member cooperates with spring means to hold a semiconductor element in good electrical and thermal contact with a base member and at least one other electrical conductor and the case simultaneously forms a portion of a complete hermetic enclosure for the semiconductor device.

Other objects of the invention will in part be obvious and will, in part, appear hereinafter.

In order to more fully understand the nature and objects of the invention, reference should be had to the following detailed description and drawings, in which.

Figures 1, 2, 3:
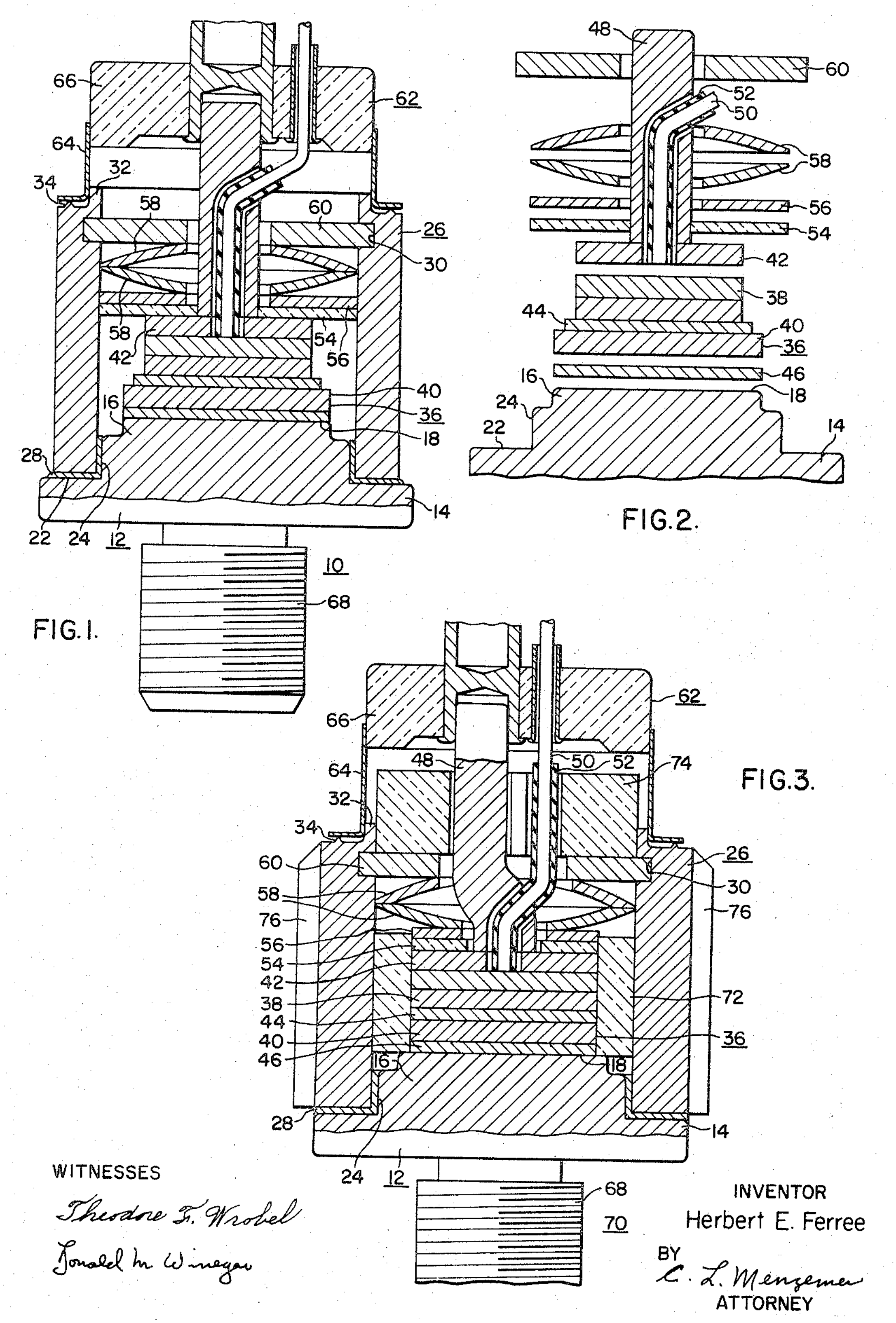
FIGURE 1 is a side view, partially in cross section, of an electrical device made in accordance with the teachings of this invention.
FIG. 2 is an exploded view, partly in cross section, detailing more specifically a portion of the device of FIG. 1.
FIG. 3 is another electrical device made in accordance with the teachings of this invention.

In accordance with the present invention and in attainment of the foregoing objects, there is provided an electrical device comprising a good electrically and thermally conductive support. The support has a peripheral flange. The peripheral flange has an upper surface. The support has an upwardly extending pedestal portion substantially centrally disposed thereon. An uppermost mounting surface is formed on the upwardly extending pedestal portion.

An upwardly extending hollow cylindrical member is affixed to the upper surface of the flange. The hollow cylindrical member has an inner peripheral wall in which an annular groove is located.

At least one spring member is disposed within the upwardly extending hollow cylindrical member. An apertured metal disc is disposed within, and retained by, the annular groove. The metal disc cooperates with the upwardly extending hollow cylindrical member to provide a constant pressure on the spring member. The spring member thereby exerts a compressive force on the electrical conductor in contact with the semiconductor element thereby providing a good electrical contact between the electrical lead, the semiconductor element and the uppermost mounting surface of the upwardly extending pedestal portion of the support.

A semiconductor element is disposed within the upwardly extending hollow cylindrical member on the uppermost mounting surface of the upwardly extending pedestal portion. At least one electrical conductor is in contact with the semiconductor element.

With reference to FIGS. 1 and 2, there is shown an electrical device 10 made in accordance with the teachings of this invention. The device 10 comprises a good electrically and thermally conductive support member 12. The support member 12 is comprised of a peripheral flange 14 and an upwardly extending pedestal portion 16. The upwardly extending pedestal portion 16 has an uppermost mounting surface 18. The peripheral flange 14 has a top surface 22 and the upwardly extending pedestal portion 16 has a peripheral side surface 24.

The support member 12 is made of a metal selected from the group consisting of copper, silver, aluminum, base alloys thereof and ferrous base alloys. Copper and brass, a base alloy of copper, have been found particularly satisfactory for this purpose.

An upwardly extending hollow cylindrical member 26 is affixed to the support member 12. The inner periphery of the member 26 conforms to the peripheral surface 24 of the pedestal portion 16. The member 26 is affixed to the support member 12 by any suitable means known to those skilled in the art, such, for example, as by disposing a suitable braze material 28 between the top surface 22 and the side surface 24 of the support member 12 and a portion of the inner periphery and all of the bottom of the cylindrical member 26.

An annular groove 30, formed in the wall of the inner periphery of the cylindrical member 26, is located remote from the end joined to the support member 12. An upwardly extending integral flange 32 is formed about the upper end of the inner periphery. An annular integral weld ring 34 is formed in the upper surface of the member 26.

The cylindrical member 26 is preferably made of a ferrous base material although other suitable materials, particularly metals, may be employed.

The pedestal portion 16 of the support member 12 having the uppermost mounting surface 18, although not required, is a preferred feature to be incorporated into the support member 12. The side surface 24 provides a greater area for affixing the upwardly extending cylindrical member 26 to the support 12. The pedestal portion 16 provides a means for raising the mounting surface 18 for a semiconductor element above the area involved for joining the member 26 to the support 12. A slight excess of braze material 28 will not interfere with the mounting surface 18 and no further finishing is required for the mounting surface 18 during normal joining operations. Should further finishing of the mounting surface 18 or an item affixed to the mounting surface 18 be required, one has adequate clearance for working with tools without damaging the inner periphery of the member 26.

A semiconductor contact assembly 36 is disposed upon the uppermost mounting surface 18 of the upwardly extending pedestal portion 16 of the support member 12. The assembly 36 comprises a semiconductor element 38, a first electrical contact 40 and a second electrical contact 42.

The semiconductor element 38 comprises a body of a semiconductor material having at least one p-n junction therein.

The first electrical contact 40 comprises a metal, such, for example, as molybdenum, tungsten, tantalum and combinations and base alloys thereof. The contact 40 is a firm supporting structure for the semiconductor element 38. The contact 40 has good electrical and thermal conductivity properties as well as very similar thermal expansion characteristics as the semiconductor element 38.

Although not required, the semiconductor element 38 is preferably joined to the first electrical contact 40 by a suitable prior joining operation. The joining of the semiconductor element 38 to the contact 40 may utilize a layer 44 of any suitable "hard" or "soft" solder known to those skilled in the art.

The solder layer 44 comprises a suitable solder, such, for example, as a silver, or a gold base solder, having a melting point above 372° C. and known to those skilled in the art as a "hard" solder. A solder having a melting point below about 372° C., and known to those skilled in the art as a "soft" solder, may also be used. Such "soft" solders are usually, but need not be, lead base solders.

It will be understood, of course, that the particular type of solder will depend on the anticipated operating temperature range of the finished device 10.

The first electrical contact 40 is separated from the uppermost mounting surface 18 of the upwardly extending pedestal portion of the support member 12 by a non-reactive, malleable, electrically and thermally conductive layer 46. The layer 46 comprises a metal selected from the group consisting of gold, silver, tin and aluminum. The layer 46 compensates for any surface irregularities which may occur on the surface 18. The layer 46 may be deposited upon the surface 18 by any suitable means known to those skilled in the art, such, for example, as electrodeposition means, or as a preformed disc of a suitable metal affixed to the surface 18 and then contoured to specific requirements.

The second electrical contact 42 comprising a metal, such, for example, as molybdenum, has electrical conductors 48 and 50 affixed thereto. A suitable insulating member 52, comprising an electrically insulating material such, for example, as a fluorocarbon, an electrically insulating rubber and an electrically insulating phenolic fibre, electrically insulates the conductors 48 and 50 from each other.

The dual electrical conductors 48 and 50 are required in devices such as controlled rectifiers. However, it should be understood that in simple diode rectifiers, only one conductor, such, for example as 48, need be employed.

It is important that the surfaces between the first electrical contact 40 and the layer 46, as well as the surfaces between the second electrical contact 42 and the semiconductor element 38 be flat and planar so that no uneven pressures develop when compressed together.

An apertured electrically insulating washer 54 is disposed about the electrical conductor 48 and upon top of the second contact 42. The insulating washer 54 comprises a material selected from the group consisting of ceramic, mica, glass, quartz and fluorocarbon.

An apertured thrust washer 56 is disposed about the electrical conductor 48 and upon the top surface of the apertured insulating washer 54. At least one apertured spring washer 58 is disposed about the electrical conductor 48 and upon the top surface of the apertured thrust washer 56.

An apertured expandable metal retaining ring 60, similar to a snap ring, is disposed about the electrical conductor 48 and within, and is retained by, the groove 30 formed in the inner periphery of the upwardly extending cylindrical member 26. The ring 60 cooperating with the cylindrical member 26 resiliently urges the apertured spring washer 58 to transmit a compression force through the apertured thrust washer 56 and thence through the apertured electrically insulating washer 54 to force the second electrical contact 42, the semiconductor element 38, the first electrical contact 40 and the uppermost mounting surface 18 of the upwardly extending pedestal portion 16 of the support member 12 into a firm, intimate, electrically conductive relationship with each other. More than one apertured spring washer 58 of the same, or different thickness, may be required to cooperate with the retaining ring 60 and the cylindrical member 26 to create the necessary compressional force required for a reliable operating device 10.

The device 10 is completed by providing a hermetic enclosure for the semiconductor element 38. This hermetic enclosure is formed by affixing an apertured header assembly 62 to the member 26. The header assembly 62 comprises an outwardly extended flanged member 64 affixed to an apertured insulating seal member 66.

The header assembly 62 is joined to the member 26 by welding the outwardly extended flanged member 64 to the annular weld ring 34. The integral flange 32 acts as a guide for positioning the header assembly 62 during assembly and joining operations.

An electrical contact and thermal dissipating stud 68 is either affixed or is integral with the support member 12. The stud 68 is used to connect the support member 12 to an electrical conductor and heat sink.

Utilizing the upwardly extending hollow cylindrical member 26 eliminates the need for a separate structure to cooperate with spring means to resiliently urge components of a compression bonded encapsulated (CBE) device into a good electrical and thermal conductive relationship with each other as well as a separate hermetic enclosure to supply a hermetic environment for the components of the CBE device. The member 26 also provides a means for increasing the electrical contact surface area to heat sink surface area by almost 50% or more over prior art devices provided both the old device and the device made in accordance with the teachings of this invention have relatively the same outside basic physical dimensions.

With reference to FIG. 3, there is shown an electrical device 70 which is the same as the electrical device 10 shown in FIGS. 1 and 2 except for a minor modification.

The modification comprises a molecular sieve 72 disposed on an outer peripheral portion of the uppermost mounting surface 18 of the upwardly extending pedestal portion 16 of the support member 12. The molecular sieve 70 has an outer periphery conforming to the inner periphery of the upwardly extending cylindrical member 26. The inner periphery of the molecular sieve 72 conforms to the side surface of the non-reactive, malleable, electrically and thermally conductive layer 46. The inner periphery of the molecular sieve facilitates the assembly of the device 70 by providing a means for centering the semiconductor contact assembly 36. The molecular sieve 72 also functions as a moisture gettering device.

Another portion of the modification comprises an apertured molecular sieve 74 disposed on the apertured expandable metal ring 60. The outer periphery of the molecular sieve 74 conforms to the inner periphery of the upwardly extending cylindrical member 26. The molecular sieve 74 positions the leads 48 and 50 for assembly operations which follow as well as functioning as a moisture and gaseous gettering element.

A plurality of flat surfaces 76 forms the outer periphery of the upwardly extending cylindrical member 26. The flat surfaces 76 facilitate connecting the electrical device 70 to an electrical conductor and heat sink.

While the invention has been described with reference to particular embodiments and examples, it will be understood of course, that modifications, substitutions and the like may be made therein without departing from its scope.

I claim as my invention:

1. An electrical device comprising (1) a good electrically and thermally conductive support, said support being comprised of a peripheral flange and an upwardly extending pedestal portion, said peripheral flange having an upper surface and said upwardly extending pedestal portion having an uppermost mounting surface; (2) an upwardly extending hollow cylindrical member, said member being affixed to said upper surface of said flange of said support and having an inner wall; (3) an annular groove, said annular groove being formed in said inner wall of said upwardly extending hollow cylindrical member; (4) a semiconductor element, said semiconductor element being disposed within said upwardly extending hollow cylindrical member and upon said uppermost mounting surface of said upwardly extending pedestal portion of said support; (5) at least one electrical conductor in contact with said semiconductor element; (6) at least one spring member, said spring member being disposed within said upwardly extending hollow cylindrical member; and (7) an apertured expandable metal disc disposed within, and retained by, said annular groove, said apertured metal disc cooperating with said upwardly extending hollow cylindrical member to provide a constant pressure on said spring member thereby exerting a compressive force on said electrical conductor in contact with said semiconductor element thereby providing a good electrical contact between said electrical conductor, said semiconductor element and said uppermost mounting surface of said upwardly extending pedestal portion of said support.

2. An electrical device comprising (1) a good electrically and thermally conductive support, said support being comprised of a peripheral flange and an upwardly extending pedestal portion, said peripheral flange having an upper surface and said upwardly extending pedestal portion having an uppermost mounting surface; (2) an upwardly extending hollow cylindrical member, said member being affixed to said upper surface of said flange of said support and having an inner peripheral wall, said inner peripheral wall enclosing said upwardly extending pedestal portion; (3) an annular groove, said annular groove being formed in said inner peripheral wall of said upwardly extending hollow cylindrical member; (4) a semiconductor contact assembly, said semiconductor contact assembly comprising a body of semiconductor material having at least one p-n junction therein, a first electrical contact and a second electrical contact, said first electrical contact being disposed within said upwardly extending hollow cylindrical member and on said uppermost mounting surface of said upwardly extending pedestal portion of said support, said body of semiconductor material being disposed on said first electrical contact, and said second electrical contact being disposed on, and in contact with, said body of semiconductor material; (5) at least one electrical conductor, said electrical conductor being affixed to said second electrical contact; (6) at least one spring member, said spring member being disposed within said upwardly extending hollow cylindrical member; and (7) an apertured expandable metal disc disposed within, and retained by, said annular groove, said apertured metal disc cooperating with said upwardly extending hollow cylindrical member to provide a constant pressure on said spring member thereby exerting a compressive force on said second electrical contact in contact with said body of semiconductor material thereby providing a good electrical contact between said second electrical contact, said body of semiconductor material, said first electrical contact and said uppermost mounting surface of said upwardly extending pedestal portion of said support.

3. An electrical device comprising (1) a good electrically and thermally conductive support, said support being comprised of a peripheral flange and an upwardly extending pedestal portion, said peripheral flange having an upper surface and said upwardly extending pedestal portion having an uppermost mounting surface; (2) an upwardly extending hollow cylindrical member, said member being affixed to said upper surface of said flange of said support, said member having an inner peripheral wall and an integral annular weld ring on the upper end surface, said inner peripheral wall enclosing said upwardly extending pedestal portion of said support; (3) an annular groove, said annular groove being formed in said inner peripheral wall of said upwardly extending hollow cylindrical member; (4) a semiconductor contact assembly, said semiconductor contact assembly comprising a body of semiconductor material having at least one p-n junction therein, a first electrical contact and a second electrical contact, said first electrical contact being disposed within said upwardly extending hollow cylindrical member on said uppermost mounting surface of said upwardly extending pedestal portion of said support, said body of semiconductor material being disposed on said first electrical contact, and said second electrical contact being disposed on, and in contact with, said body of semiconductor material; (5) at least one electrical conductor, said electrical conductor being affixed to said second electrical contact; (6) at least one spring member, said spring member being disposed within said upwardly extending hollow cylindrical member; (7) an apertured expandable metal disc disposed within, and retained by, said annular groove, said apertured metal disc cooperating with said upwardly extending hollow cylindrical member to provide a constant pressure on said spring member thereby exerting a compressive force on said second electrical contact in contact with said body of semiconductor material thereby providing a good electrical contact between said second electrical contact, said body of semiconductor material, said first electrical contact and said uppermost mounting surface of said upwardly extending pedestal portion of said support; and (8) a stud, said stud extending from the opposite surface of said support, said stud providing a means for connecting said electrical device to an electrical conductor and a heat sink.

4. An electrical device comprising (1) a good electrically and thermally conductive support, said support comprising a metal selected from the group consisting of copper, silver, aluminum, base alloys thereof and ferrous base alloys, said support is comprised of a peripheral flange and an upwardly extending pedestal portion, said peripheral flange having an upper surface and said upwardly extending pedestal portion having an uppermost mounting surface; (2) an upwardly extending hollow cylindrical member, said member being hermetically affixed to said upper surface of said flange of said support, said member having an inner peripheral wall and an integral annular weld ring on the upper end surface, said inner peripheral wall enclosing said upwardly extending pedestal portion; (3) an annular groove, said annular groove being formed in said inner peripheral wall of said upwardly extending hollow cylindrical member; (4) a semiconductor contact assembly, said semiconductor contact assembly comprising a body of semiconductor material having at least one p-n junction therein, a first electrical contact and a second electrical contact, said first electrical contact being disposed within said upwardly extending hollow cylindrical member and on said uppermost mounting surface of said upwardly extending pedestal portion of said support, said body of semiconductor material being disposed on said first electrical contact, and said second electrical contact being disposed on, and in contact with, said body of semiconductor material; (5) at least one electrical conductor, said electrical conductor being affixed to said second electrical contact; (6) at least one spring member, said spring member being disposed within said upwardly extending hollow cylindrical member; (7) an apertured expandable metal disc disposed within, and retained by, said annular groove, said apertured metal disc cooperating with said upwardly extending hollow cylindrical member to provide a constant pressure on said spring member thereby exerting a compressive force on said second electrical contact in contact with said body of semiconductor material thereby providing a good electrical contact between said second electrical contact, said body of semiconductor material, said first electrical contact and said uppermost mounting surface of said upwardly extending pedestal portion of said support; and (8) a stud, said stud extending from the opposite surface of said support, said stud providing a means for connecting said electrical device to an electrical conductor and a heat sink.

5. An electrical device comprising (1) a good electrically and thermally conductive support, said support is comprised of a peripheral flange and an upwardly extending pedestal portion, said peripheral flange having an upper surface and said upwardly extending pedestal portion having an uppermost mounting surface; (2) an upwardly extending hollow cylindrical member, said member being hermetically affixed to said upper surface of said flange of said support and having an inner peripheral wall, said inner peripheral wall enclosing said upwardly extending pedestal portion; (3) an annular groove, said annular groove being formed in said inner peripheral wall of said upwardly extending hollow cylindrical member; (4) a semiconductor contact assembly, said semiconductor contact assembly comprising a body of semiconductor material having at least one p-n junction therein, a first electrical contact and a second electrical contact, said first electrical contact being disposed within said upwardly extending hollow cylindrical member and on said uppermost mounting surface of said upwardly extending pedestal portion of said support, said body of semiconductor material being disposed on said first electrical contact, and said second electrical contact being disposed on, and in contact with, said body of semiconductor material; (5) at least one electrical conductor, said electrical conductor being affixed to said second electrical contact; (6) at least one spring member, said spring member being disposed within said upwardly extending hollow cylindrical member; (7) an apertured expandable metal disc disposed within, and retained by, said annular groove, said apertured metal disc cooperating with said upwardly extending hollow cylindrical member to provide a constant pressure on said spring member thereby exerting a compressive force on said second electrical contact in contact with said body of semiconductor material thereby providing a good electrical contact between said second electrical contact, said body of semiconductor material, said first electrical contact and said uppermost mounting surface of said upwardly extending pedestal portion of said support; (8) an apertured header member, said apertured header member hermetically joined to said upwardly extending hollow cylindrical member, said electrical lead passing through the aperture of said header member; and (9) means for hermetically sealing said electrical lead in said aperture to provide a hermetic enclosure for said body of semiconductor material.

6. An electrical device comprising (1) a good electrically and thermally conductive support, said support comprising a metal selected from the group consisting of copper, silver, aluminum, base alloys thereof and ferrous base alloys, said support is comprised of a peripheral flange and an upwardly extending pedestal portion, said peripheral flange having an upper surface and said upwardly extending pedestal portion having an uppermost mounting surface; (2) an upwardly extending hollow cylindrical member, said member being hermetically affixed to said upper surface of said flange of said support, said member having an inner peripheral wall and an integral annular weld ring on the upper surface, said inner peripheral wall enclosing said upwardly extending pedestal portion; (3) an annular groove, said annular groove being formed in said inner peripheral wall of said upwardly extending hollow cylindrical member; (4) a semiconductor contact assembly, said semiconductor contact assembly comprising a body of semiconductor material having at least one p-n junction therein, a first electrical contact and a second electrical contact, said first electrical contact being disposed within said upwardly extending hollow cylindrical member and on said uppermost mounting surface of said upwardly extending pedestal portion of said support, said body of semiconductor material being disposed on said first electrical contact, and said second electrical contact being disposed on, and in contact with, said body of semiconductor material; (5) at least one electrical conductor, said electrical conductor being affixed to said second electrical contact; (6) at least one spring member, said spring member being disposed within said upwardly extending hollow cylindrical member; (7) an apertured metal disc disposed within, and retained by, said annular groove, said apertured metal disc cooperating with said upwardly extending hollow cylindrical member to provide a constant pressure on said spring member thereby exerting a compressive force on said second electrical contact in contact with said body of semiconductor material thereby providing a good electrical contact between said second electrical contact, said body of semiconductor material, said first electrical contact and said uppermost mounting surface of said upwardly extending pedestal portion of said support; (8) an apertured header member, said apertured header member being hermetically joined to said annular weld ring of said upwardly extending hollow cylindrical member, said electrical lead passing through, and being hermetically sealed to, said aperture of said header member, said header member cooperating with said upwardly extending hollow cylindrical member to hermetically enclose said body of semiconductor material; and (9) a stud, said stud extending from the opposite surface of said support, said stud providing a means for connecting said electrical device to an electrical conductor and a heat sink.

7. An electrical device comprising (1) a good electrically and thermally conductive support, said support is comprised of a peripheral flange and an upwardly extending pedestal portion, said peripheral flange having an upper surface and said upwardly extending pedestal portion having an uppermost mounting surface; (2) an upwardly extending hollow cylindrical member, said member being hermetically affixed to said upper surface of said flange of said support and having an inner peripheral wall, said inner peripheral wall enclosing said upwardly extending pedestal portion; (3) a hollow cylindrical molecular sieve within said upwardly extending hollow cylindrical member and on an outer peripheral portion of said uppermost mounting surface of said upwardly extending pedestal portion of said support, said hollow cylindrical molecular sieve having an outer periphery conforming to said inner peripheral wall of said upwardly extending hollow cylindrical member; (4) an annular groove, said annular groove being formed in said inner peripheral wall of said upwardly extending hollow cylindrical member; (5) a semiconductor contact assembly, said semiconductor contact assembly comprising a body of semiconductor material having at least one p-n junction therein, a first electrical contact and a second electrical contact, said first electrical contact being disposed within said hollow cylindrical molecular sieve and on the remaining portion of said uppermost mounting surface of said upwardly extending pedestal portion of said support, said body of semiconductor material being disposed on said first electrical contact, and said second electrical contact being disposed on, and in contact with, said body of semiconductor material; (6) at least one electrical conductor, said electrical conductor being affixed to said second electrical contact; (7) at least one spring member, said spring member being disposed within said upwardly extending hollow cylindrical member; (8) an apertured metal disc disposed within, and retained by, said annular groove, said apertured metal disc cooperating with said upwardly extending hollow cylindrical member to provide a constant pressure on said spring member thereby exerting a compressive force on said second electrical contact in contact with said body of semiconductor material thereby providing a good electrical contact between said second electrical contact, said body of semiconductor material, said first electrical contact and said uppermost mounting surface of said upwardly extending pedestal portion of said support; (9) an apertured molecular sieve disposed on said metal disc, said apertured molecular sieve having an outer periphery corresponding with said inner periphery of said upwardly extending hollow cylindrical member, said electrical conductor passing through the aperture of said apertured molecular sieve; and (10) an apertured header member, said apertured header member being hermetically joined to said upwardly extending hollow cylindrical member, said electrical conductor passing through, and being hermetically sealed to, said aperture of said header member, said header member cooperating with said upwardly extending hollow cylindrical member to hermetically enclose said body of semiconductor material.

8. An electrical device comprising (1) a good electrically and thermally conductive support, said support is comprised of a peripheral flange and an upwardly extending pedestal portion, said peripheral flange having an upper surface and said upwardly extending pedestal portion having an uppermost mounting surface; (2) an upwardly extending hollow cylindrical member, said member being hermetically affixed to said upper surface of said flange of said support, said upwardly extending hollow cylindrical member having an inner peripheral wall and an integral annular weld ring in the upper end surface, said inner peripheral wall enclosing said upwardly extending pedestal portion; (3) a hollow cylindrical molecular sieve disposed within said upwardly extending hollow cylindrical member and on an outer peripheral portion of said upwardly extending pedestal portion of said support, said hollow cylindrical molecular sieve having an outer periphery conforming to said inner periphery wall of said upwardly extending hollow cylindrical member; (4) an annular groove, said annular groove being formed in said inner peripheral wall of said upwardly extending hollow cylindrical member; (5) a semiconductor contact assembly, said semiconductor contact assembly comprising a body of semiconductor material having at least one p-n junction therein, a first electrical contact and a second electrical contact, said first electrical contact being disposed within said hollow cylindrical molecular sieve and on the remaining portion of said uppermost mounting surface of said upwardly extending pedestal portion of said support, said body of semiconductor material being disposed on said first electrical contact, and said second electrical contact being disposed on, and in contact with, said body of semiconductor material; (6) at least one electrical conductor, said electrical conductor being affixed to said second electrical contact; (7) at least one spring member, said spring member being disposed within said upwardly extending hollow cylindrical member; (8) an apertured metal disc disposed within, and retained by, said annular groove, said apertured metal disc cooperating with said upwardly extending hollow cylindrical member to provide a constant pressure on said spring member thereby exerting a compressive force on said second electrical contact in contact with said body of semiconductor material thereby providing a good electrical contact between said second electrical contact, said body of semiconductor material, said first electrical contact and said uppermost mounting surface of said upwardly extending pedestal portion of said support; (9) an apertured molecular sieve disposed on said metal disc, said apertured molecular sieve having an outer periphery corresponding to said inner periphery of said upwardly extending hollow cylindrical member, said electrical conductor passing through the aperture of said molecular sieve; (10) an apertured header member, said apertured header member being hermetically affixed to said annular weld ring of said upwardly extending hollow cylindrical member, said electrical conductor passing through, and being hermetically sealed to, said aperture of said header member, said header member cooperating with said upwardly extending hollow cylindrical member to hermetically enclose said body of semiconductor material; and (11) a stud, said stud extending from the opposite surface of said support, said stud providing a means for connecting said electrical device to an electrical conductor and a heat sink.

9. An electrical device comprising (1) a good electrically and thermally conductive support, said support comprising a metal selected from the group consisting of copper, silver, aluminum, base alloys thereof and ferrous base alloys, said support is comprised of a peripheral flange and an upwardly extending pedestal portion, said peripheral flange having an upper surface and said upwardly extending pedestal portion having an uppermost mounting surface; (2) an upwardly extending hollow cylindrical member, said member being hermetically affixed to said upper surface of said flange of said support and having an inner peripheral wall, said inner peripheral wall enclosing said upwardly extending pedestal portion; (3) a hollow cylindrical molecular sieve disposed within said upwardly extending hollow cylindrical member and on an outer peripheral portion of said upwardly extending pedestal portion of said support, said hollow cylindrical molecular sieve having an outer periphery conforming to said inner peripheral wall of said upwardly extending hollow cylindrical member; (4) an annular groove, said annular groove being formed in said inner peripheral wall of said upwardly extending hollow cylindrical member; (5) a semiconductor contact assembly, said semiconductor contact assembly comprising a body of semiconductor material having at least one p-n junction therein, a first electrical contact and a second electrical contact, said first electrical contact being disposed within said hollow cylindrical molecular sieve and on the remaining portion of said uppermost mounting surface of said upwardly extending pedestal portion of said support, said body of semiconductor material being disposed on said first electrical contact, and said second electrical contact being disposed on, and in contact with, said body of semiconductor material; (6) at least one electrical conductor, said electrical conductor being affixed to said second electrical contact; (7) at least one spring member, said spring member being disposed within said upwardly extending hollow cylindrical member; (8) an apertured metal disc disposed within, and retained by, said annular groove, said apertured metal disc cooperating with said upwardly extending hollow cylindrical member to provide a constant pressure on said spring member thereby exerting a compressive force on said second electrical contact in contact with said body of semiconductor material thereby providing a good electrical contact between said second electrical contact, said body of semiconductor material, said first electrical contact and said uppermost mounting surface of said upwardly extending pedestal portion of said support; (9) an apertured molecular sieve disposed on said metal disc, said apertured molecular sieve having an outer periphery corresponding to said inner periphery of said upwardly extending hollow cylindrical member, said electrical conductor passing through the aperture of said molecular sieve; (10) an apertured header member, said apertured header member being hermetically affixed to said annular weld ring of said upwardly extending hollow cylindrical member, said electrical conductor passing through, and being hermetically sealed to, said aperture of said header member, said header member cooperating with said upwardly extending hollow cylindrical member to hermetically enclose said body of semiconductor material; and (11) a stud, said stud extending from the opposite surface of said support, said stud providing a means for connecting said electrical device to an electrical conductor and a heat sink.

References Cited

UNITED STATES PATENTS

| | | | |
|---|---|---|---|
| 2,946,935 | 7/1960 | Finn | 317—234 |
| 3,170,098 | 2/1965 | Marino | 317—234 |
| 3,221,219 | 11/1965 | Emeis et al. | 317—234 |
| 3,252,060 | 5/1966 | Marino et al. | 317—234 |

JOHN W. HUCKERT, *Primary Examiner.*

A. M. LESNIAK, *Assistant Examiner.*